United States Patent [19]

Nicollini et al.

[11] Patent Number: 5,955,922
[45] Date of Patent: Sep. 21, 1999

[54] TWO-STAGE FULLY DIFFERENTIAL OPERATIONAL AMPLIFIER WITH EFFICIENT COMMON MODE FEED-BACK CIRCUIT

[75] Inventors: Germano Nicollini, Piacenza, Italy; Daniel Senderowicz, Berkeley, Calif.

[73] Assignee: SGS-Thomson Microelectronics S.r.l., Agrate Brianza, Italy

[21] Appl. No.: 08/956,274

[22] Filed: Oct. 22, 1997

[30] Foreign Application Priority Data

Oct. 30, 1996 [EP] European Pat. Off. .............. 96830555

[51] Int. Cl.$^6$ ...................................................... H03F 3/45
[52] U.S. Cl. ............................................ 330/258; 330/257
[58] Field of Search .................... 330/258, 253, 330/257

[56] References Cited

U.S. PATENT DOCUMENTS

| | | | |
|---|---|---|---|
| 5,146,179 | 9/1992 | Carley et al. ............................ | 330/253 |
| 5,212,455 | 5/1993 | Pernici et al. ........................... | 330/253 |
| 5,281,924 | 1/1994 | Maloberti et al. ....................... | 330/258 |
| 5,319,316 | 6/1994 | Fensch .................................... | 330/258 |
| 5,442,318 | 8/1995 | Badyal et al. ........................... | 330/258 |
| 5,515,003 | 5/1996 | Kimura ................................... | 330/253 |
| 5,578,964 | 11/1996 | Kim et al. ............................... | 330/258 |
| 5,729,178 | 3/1998 | Park et al. ............................... | 330/258 |

FOREIGN PATENT DOCUMENTS

| | | |
|---|---|---|
| 0 325 299 A2 | 7/1989 | European Pat. Off. . |
| 362216509A | 9/1987 | Japan ..................................... 330/258 |
| 401126811A | 5/1989 | Japan ..................................... 330/258 |
| 404243308A | 8/1992 | Japan ..................................... 330/258 |

OTHER PUBLICATIONS

Proceedings of the Custom Integrated Circuits Conference, San Diego, May 1–4, 1994, Institute of Electrical and Electronics Engineers, pp. 365–368, Ochotta et al., "Analog Circuit Synthesis for Large, Realistic Cells: Designing a Pipelined A/D Converter With ASTRX/OBLX".

*Primary Examiner*—Robert Pascal
*Assistant Examiner*—Khanh Van Nguyen
*Attorney, Agent, or Firm*—Allen, Dyer, Doppelt, Milbrath & Gilchrist, P.A.

[57] ABSTRACT

The circuit of a two-stage fully differential amplifier includes a differential input stage, two output stages and a common mode feedback circuit coupled to the output nodes of the amplifier. The amplifier also includes a non-inverting stage coupled to a respective output node of the differential input stage for driving the respective output stage. Each auxiliary non-inverting stage of the two branches of the fully differential amplifier uses as a biasing current generator, the load device of the branch of the differential input stage to the output of which the non-inverting stage is coupled. The fully differential amplifier permits the use of a null-consumption common mode feedback circuit as normally employed only in a single stage fully differential amplifier.

13 Claims, 3 Drawing Sheets

TWO-STAGE FULLY DIFFERENTIAL OPERATIONAL AMPLIFIER WITH EFFICIENT COMMON MODE FEED-BACK CIRCUIT

FIELD OF THE INVENTION

The present invention relates to integrated circuits, and, more particularly, to a fully differential operational amplifier circuit, that is, to an amplifier having a differential output.

BACKGROUND OF THE INVENTION

Operational amplifiers are important building blocks and, as such, they are widely used in many analog signal processing systems. In many applications it is convenient to use a fully differential operational amplifier, that is to say an amplifier having a differential output. As is known to those skilled in the art, a fully differential operational amplifier requires a common mode feedback circuit to operate properly. The article entitled "A family of Differential NMOS Analog Circuit for PCM Code Filter Chip," IEEE JSSC, December 1982, for example, is a review of this type of circuit.

In substance, as it is shown in FIG. 1, a fully differential amplifier amplifies a differential input signal (Vid) and provides a differential output signal (Vod). The fully differential amplifier is also provided with an auxiliary input (INCM) through which control of the common mode at the outputs nodes (Vcm) is applied to set it exactly half-way between the voltages of the supply rails ($V_{DD}$ and $V_{SS}$). In single-stage fully differential amplifiers, the common mode feedback circuit may be considered extremely efficient as it does not require any significant current consumption. As indicated in a simplified manner in FIG. 2, $V_R$ and $V_B$ are two reference voltages, which can respectively be equal to about ($V_{DD}+V_{SS}$)/2 and $V_{GSm3}$.

On the other hand, in those applications where it is essential to ensure the maximum output voltage swing (ideally equal to the supply voltage), like for instance in systems which function at low and extremely low supply voltages, it becomes necessary to employ at least a two-stage, fully differential amplifier. In these cases, the common mode feedback circuit cannot be realized the same as for a single-stage amplifier according to the scheme shown in FIG. 2, because two inversions would occur between the feedback node INCM and the output nodes. This would result in a positive feedback that would make the system unstable.

Up until now, the conventional approach for realizing a common mode control loop in a two-stage amplifier has been that of adding an inverting stage to the feedback circuit of FIG. 2, to have three inversions in the common mode feedback circuit, according to a scheme as shown in FIG. 3. However, this approach is inefficient because of the additional current consumption that is not even minimally exploited by the differential signal, since the differential signal practically does not "see" this additional inverting stage. Especially in low voltage, battery-operated systems it is important to minimize the current consumption.

SUMMARY OF THE INVENTION

Hence, an object of the present invention is that of providing a circuit implementing an efficient common mode control in a two-stage fully differential amplifier, without causing any additional power consumption.

This objective is fully met by the circuit of the invention. Basically, the circuit of the two-stage fully differential amplifier of the invention is characterized in that it comprises a non-inverting stage having an input coupled to the respective output node of the differential input stage of the amplifier, and an output coupled to a driving node of the respective second output stage of the operational amplifier. Each non-inverting stage advantageously uses as a biasing current generator the branch load device of the branch of the differential input stage to which the non-inverting stage is coupled. This modified structure of the two-stage fully differential amplifier circuit uses a null consumption common mode feedback circuit, identical to that used in the case of a single-stage operational amplifier, thus eliminating any undue consumption of additional current.

BRIEF DESCRIPTION OF THE DRAWINGS

The different aspects and advantages of the circuit of the invention will become even more evident through the following description of an important embodiment and by referring to the attached drawings, wherein.

DETAILED DESCRIPTION OF THE PREFERRED EMBODIMENTS

Figure 4:
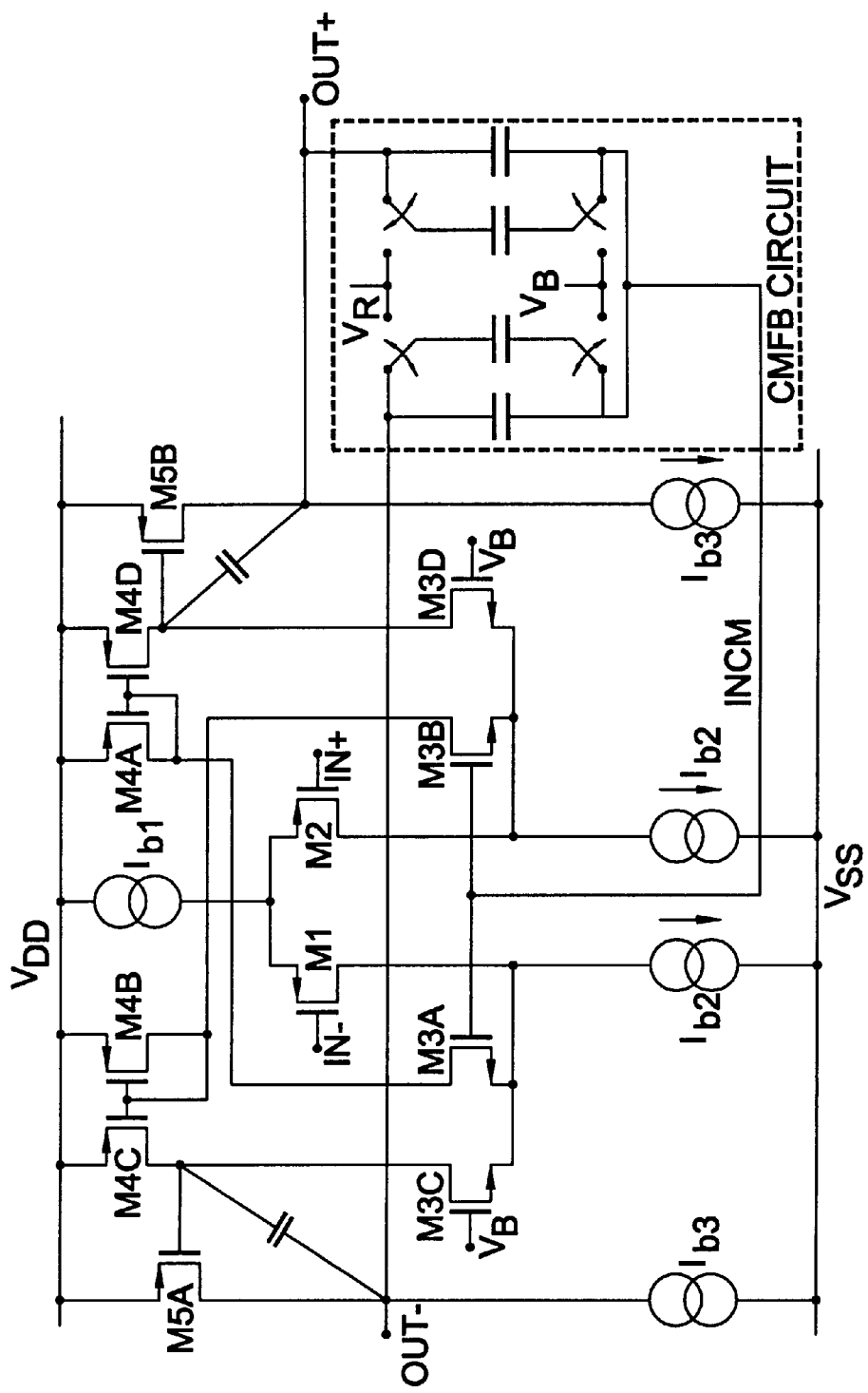
FIG. 4 shows a modified scheme of a two-stage fully differential amplifier including a common mode feedback circuit, according to the present invention.

With reference to FIG. 4, there is a non-inverting stage between the differential input stage of the amplifier provided by the pair of input transistors M1 and M2, the current generator Ib1 and by the load current generators Ib2, and each of the two output stages of the amplifier respectively provided by M5A and Ib3 and by M5B and Ib3. The two non-inverting stages are realized by the transistors M4C, M4B, M3C, M3A, M4A, M4D, M3D and M3B. Essentially, each of the two non-inverting stages uses a biasing current generator of the same load device (Ib2) of the branch of the differential input stage, and to which the output node of the inverting stage is coupled.

Each non-inverting stage comprises a differential pair of input transistors, respectively M3C, M3A and M3B, M3D, in a common source configuration, whose common source node is coupled to the output node of the respective branch of the differential input stage, and by a current mirror circuit acting as load. The input node of each of the two load current mirror circuits of the respective non-inverting stages is cross-coupled to the drain of a first input transistor of the non-inverting stage. The second input of each non-inverting stage is biased at a constant reference voltage VB.

Figure 1:
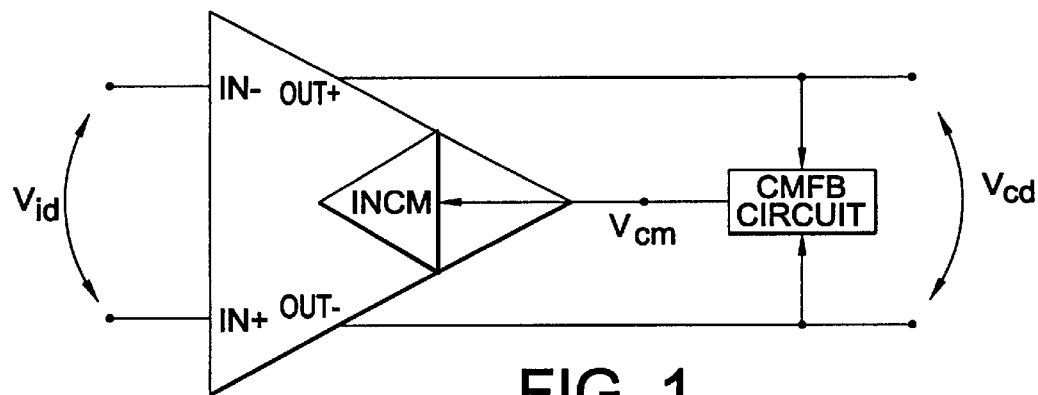
FIG. 1 as mentioned, is a functional scheme of an operational amplifier with a differential output as in the prior art.
Figure 2:
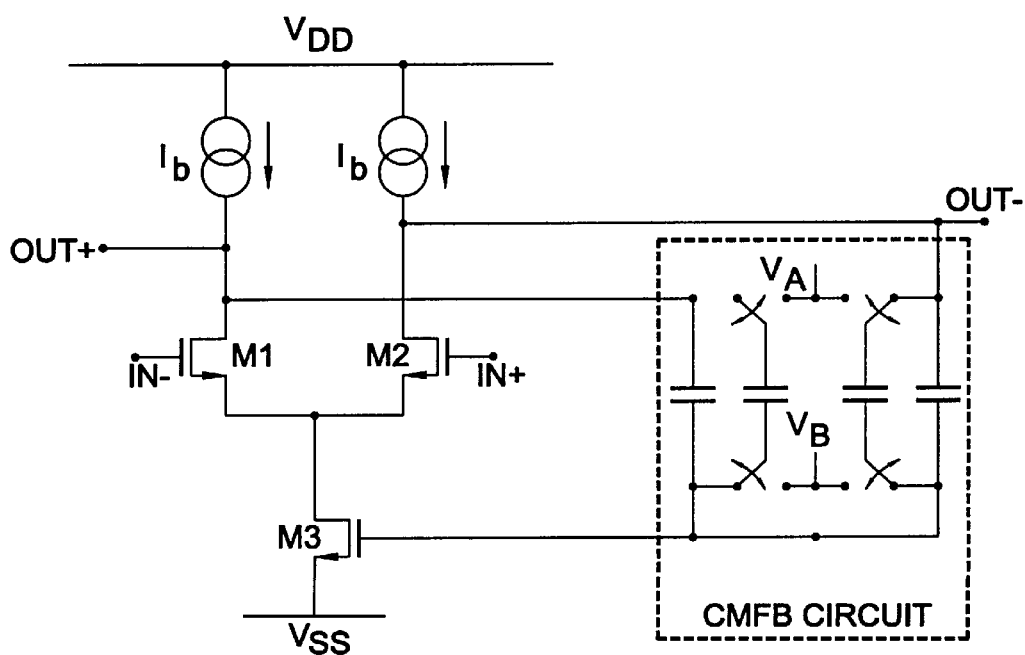
FIG. 2 is the scheme of a differential output amplifier that include a common mode feedback circuit as in the prior art.
Figure 3:
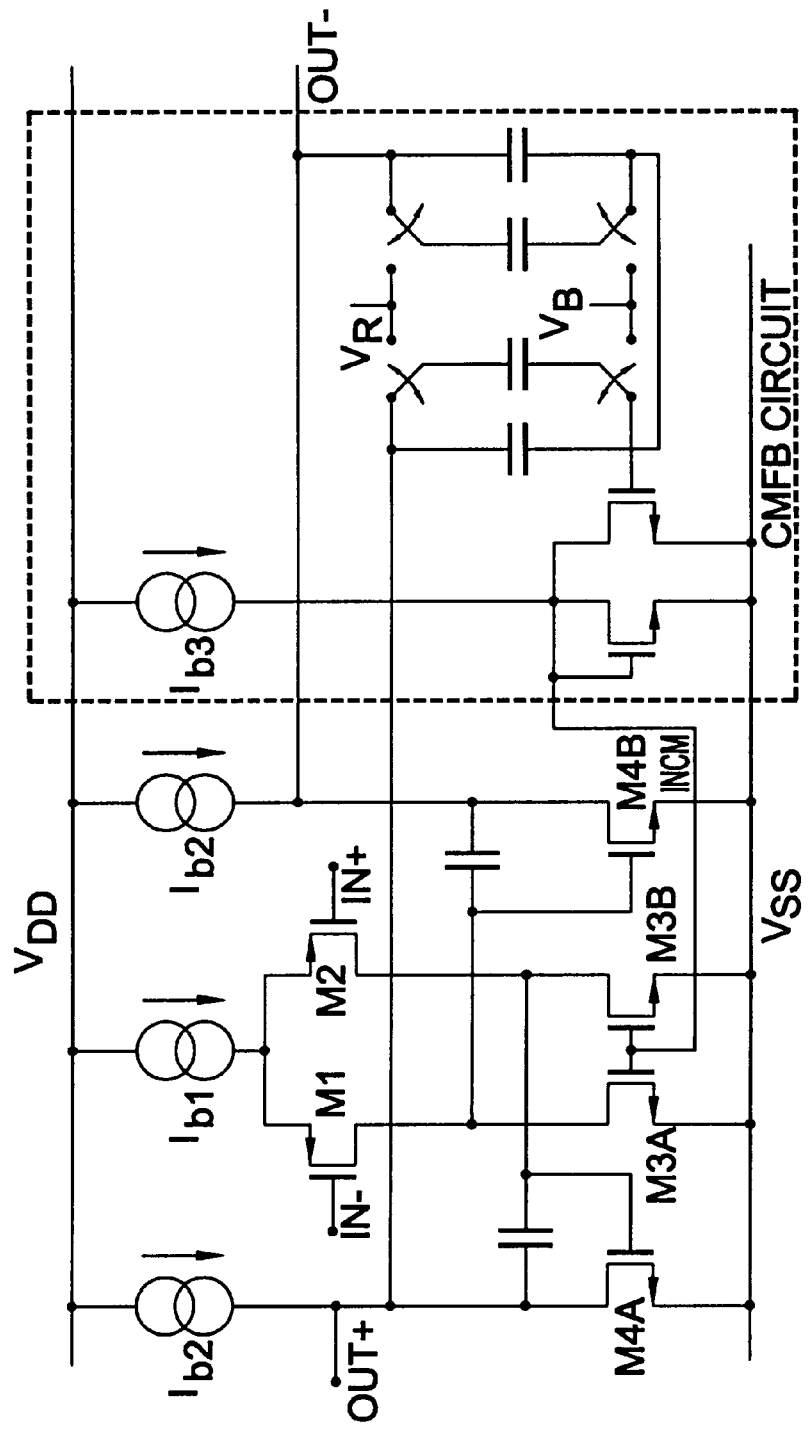
FIG. 3 shows a the scheme of a two-stage fully differential amplifier including a common mode feedback circuit according to the prior art, as previously described.

This particular circuit structure of the two-stage fully differential amplifier of the invention is instrumental for the use as a common mode feedback circuit of a switched-capacitor circuit, CMFB, of null consumption, perfectly identical to the circuit used in the case of a single-stage differential output amplifier. This advantageously does not require an inverting stage in the feedback loop as shown in FIG. 3. In fact, as it can be easily verified, the common mode feedback is negative.

In the illustrated example, $V_R$ may be equal to about ($V_{DD}+V_{SS}$)/2 and $V_B$ may be equal or greater than the sum $V_{GSm3}+V_{DSAT}$, where $V_{GSm3}$ is the gate-source voltage of the input transistors of the two non-inverting stages (M3A, ..., M3D) and $V_{DSAT}$ that represents the minimum voltage for which the load current generators $I_{b2}$ of the differential input stage become saturated.

That which is claimed is:

1. A two-stage differential amplifier comprising:

a differential input stage having a pair of output nodes and comprising a pair of branches, each branch comprising a load device;

a pair of output stages, each having a driving node;

a common mode feedback circuit coupled to said pair of output stages; and a pair of non-inverting stages, each non-inverting stage having an input coupled to a respective output node of said differential input stage so that the load device of the respective branch serves as a biasing current generator for the non-inverting stage, each non-inverting stage also having an output coupled to the driving node of the respective output stage, each non-inverting stage comprising a differential pair of first and second input transistors arranged in a common source configuration and with a common source node coupled to the output node of the respective branch of said differential input stage, and a load current mirror circuit having an input node being cross-coupled to a drain of an opposite first transistor of said differential pair of input transistors.

2. An amplifier according to claim 1, wherein each of said non-inverting stages also has a second input node being coupled to a reference voltage.

3. An amplifier according to claim 2, wherein said common mode feedback circuit is coupled to a first common input node of said two non-inverting stages; and wherein said reference voltage is greater or equal to a sum of gate-source voltages of said differential pair of first and second input transistors and a minimum saturation voltage of the load devices of the branches of said differential input stage.

4. A multi-stage differential amplifier comprising:

a differential input stage comprising a pair of branches;

a pair of output stages;

a common mode feedback circuit coupled to said pair of output stages; and a pair of non-inverting stages coupled between branches of said differential input stage and said pair of output stages, and coupled to said common mode feedback circuit, each non-inverting stage comprising a differential pair of first and second input transistors arranged in a common source configuration and with a common source node coupled to the output node of the respective branch of said differential input stage, and a load current mirror circuit having an input node being cross-coupled to a drain of an opposite first transistor of said differential pair of input transistors.

5. An amplifier according to claim 4, wherein each branch comprises a load device; wherein each non-inverting stage is coupled to a respective output of said differential input stage so that the load device of t he respective branch serves as a biasing current generator for the non-inverting stage; and wherein each non-inverting stage also has an output coupled to a driving node of the respective output stage.

6. An amplifier according to claim 4, wherein each of said non-inverting stages also has a second input node being coupled to a reference voltage.

7. An amplifier according to claim 6, wherein said common mode feedback circuit is coupled to a first common input node of said two non-inverting stages; and wherein said reference voltage is greater or equal to a sum of gate-source voltages of said differential pair of first and second input transistors and a minimum saturation voltage of the load devices of the branches of said differential input stage.

8. A multi-stage differential amplifier comprising:

a differential input stage comprising a pair of branches;

a pair of output stages;

a common mode feedback circuit coupled to said pair of output stages; and a pair of non-inverting stages coupled between branches of said differential input stage and said pair of output stages, and coupled to said common mode feedback circuit, each of said non-inverting stages also being coupled to a reference voltage, each non-inverting stage comprising a differential pair of first and second input transistors arranged in a common source configuration and with a common source node coupled to the output node of the respective branch of said differential input stage, and a load current mirror circuit having an input node being cross-coupled to a drain of an opposite first transistor of said differential pair of input transistors.

9. An amplifier according to claim 8, wherein each branch comprises a load device; wherein each non-inverting stage is coupled to a respective output of said differential input stage so that the load device of the respective branch serves as a biasing current generator for the non-inverting stage; and wherein each non-inverting stage also has an output coupled to a driving node of the respective output stage.

10. An amplifier according to claim 8, wherein said common mode feedback circuit is coupled to a first common input node of said two non-inverting stages; and wherein said reference voltage is greater or equal to a sum of gate-source voltages of said differential pair of first and second input transistors and a minimum saturation voltage of the load devices of the branches of said differential input stage.

11. A multi-stage differential amplifier comprising:

a differential input stage comprising a pair of branches;

a pair of output stages;

a common mode feedback circuit coupled to said pair of output stages; and a pair of non-inverting stages coupled between branches of said differential input stage and said pair of output stages, and coupled to said common mode feedback circuit, each non-inverting stage having a second input node being coupled to a reference voltage greater or equal to a sum of gate-source voltages of said differential pair of first and second input transistors and a minimum saturation voltage of the load devices of the branches of said differential input stage;

said common mode feedback circuit being coupled to a first common input node of said two non-inverting stages.

12. A multi-stage differential amplifier according to claim 11, wherein each branch comprises a load device; wherein each non-inverting stage is coupled to a respective output of said differential input stage so that the load device of the respective branch serves as a biasing current generator for the non-inverting stage; and wherein each non-inverting stage also has an output coupled to a driving node of the respective output stage.

13. A multi-stage differential amplifier according to claim 12, wherein each of said non-inverting stages comprises:

a differential pair of first and second input transistors arranged in a common source configuration and with a common source node coupled to the output node of the respective branch of said differential input stage; and a load current mirror circuit having an input node being cross-coupled to a drain of an opposite first transistor of said differential pair of input transistors.

* * * * *